US012681320B2

(12) United States Patent
Matejka et al.

(10) Patent No.: US 12,681,320 B2
(45) Date of Patent: Jul. 14, 2026

(54) OPTICAL SYSTEM, IN PARTICULAR FOR CHARACTERIZING A MICROLITHOGRAPHY MASK

(71) Applicant: Carl Zeiss SMT GmbH, Oberkochen (DE)

(72) Inventors: Ulrich Matejka, Jena (DE); Sascha Perlitz, Jena (DE); Johannes Ruoff, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 578 days.

(21) Appl. No.: 18/095,175

(22) Filed: Jan. 10, 2023

(65) Prior Publication Data

US 2023/0221571 A1      Jul. 13, 2023

(30) Foreign Application Priority Data

Jan. 12, 2022    (DE) ......................... 102022100591.7

(51) Int. Cl.
| | |
|---|---|
| *G02B 27/14* | (2006.01) |
| *G03F 7/00* | (2006.01) |
| *G03F 7/20* | (2006.01) |

(52) U.S. Cl.
CPC ....... *G02B 27/142* (2013.01); *G03F 7/70133* (2013.01)

(58) Field of Classification Search
CPC .......... G02B 1/10; G02B 27/14; G02B 27/10; G02B 27/142; G02B 5/18; G02B 5/20; G02B 5/208; G02B 5/285; G02B 5/0891; G01N 21/956; G01N 21/8806; G01N 21/88; G01N 21/8851; G01N 21/9501; G01N 2021/95676; G03F 7/20; G03F 7/00; G03F 7/70133; G03F 7/2002; G03F 7/2004; G03F 7/70233; G03F 7/70058; G03F 7/70191; G03F 7/70158; G03F 1/84
USPC ....... 359/359–361, 350, 351, 355, 586, 589, 359/614
See application file for complete search history.

(56) References Cited

U.S. PATENT DOCUMENTS

| | | |
|---|---|---|
| 4,870,648 A | 9/1989 | Ceglio et al. |
| 7,911,600 B2 | 3/2011 | Terasawa et al. |
| 7,982,854 B2 | 7/2011 | Mann et al. |
| 9,129,717 B2 | 9/2015 | Lambert et al. |
| | (Continued) | |

FOREIGN PATENT DOCUMENTS

| | | |
|---|---|---|
| CN | 102354045 A | 2/2012 |
| CN | 107810445 A | 2/2012 |
| | (Continued) | |

OTHER PUBLICATIONS

English translation of DE 102017221146. (Year: 2018).*

(Continued)

*Primary Examiner* — Jie Lei
(74) *Attorney, Agent, or Firm* — Fish & Richardson P.C.

(57)      ABSTRACT

The invention relates to an optical system and, in particular for characterizing a microlithography mask, comprising a light source for generating light of a wavelength of less than 30 nm, an illumination beam path leading from the light source to an object plane, an imaging beam path leading from the object plane to an image plane and a beam splitter, via which both the illumination beam path and the imaging beam path run.

20 Claims, 7 Drawing Sheets

(56) References Cited

U.S. PATENT DOCUMENTS

| | | | |
|---|---|---|---|
| 2008/0192225 A1 | 8/2008 | Mann et al. | |
| 2008/0309907 A1 | 12/2008 | Stuetzle | |
| 2009/0091752 A1* | 4/2009 | Terasawa ................ | G03F 1/84 |
| | | | 356/237.5 |
| 2010/0231884 A1 | 9/2010 | Mann | |
| 2012/0081684 A1 | 4/2012 | Den Oef et al. | |
| 2014/0240686 A1 | 8/2014 | Ruoff et al. | |
| 2014/0347721 A1 | 11/2014 | Bittner et al. | |
| 2015/0192459 A1 | 7/2015 | Kvamme | |
| 2017/0248851 A1 | 8/2017 | Endres et al. | |
| 2019/0129299 A1 | 5/2019 | Nasalevich et al. | |
| 2020/0182803 A1 | 6/2020 | Sendoda et al. | |
| 2020/0348602 A1 | 11/2020 | Ruoff et al. | |
| 2021/0158500 A1 | 5/2021 | Sousa et al. | |
| 2021/0223531 A1 | 7/2021 | Guo et al. | |
| 2021/0397099 A1 | 12/2021 | Ruoff et al. | |

FOREIGN PATENT DOCUMENTS

| | | | |
|---|---|---|---|
| CN | 113317784 A | 8/2021 | |
| DE | 10 2008 011 761 A1 | 9/2008 | |
| DE | 102008000990 | 11/2009 | ............... G03F 7/20 |
| DE | 102012202057 | 8/2013 | ............ G02B 17/06 |
| DE | 102014222534 | 11/2015 | ............... G02B 1/14 |
| DE | 10 2014 223 452 A1 | 5/2016 | |
| DE | 102017221146 | 3/2018 | ............... G03F 7/20 |
| DE | 102020207566 | 12/2021 | ............... G03F 1/84 |
| DE | 102021113780 | 12/2022 | ............... G03F 1/00 |
| EP | 0 341 385 A2 | 11/1989 | |
| JP | 4761588 B1 | 8/2011 | |
| JP | 2012-059984 A | 3/2012 | ............ H01L 21/027 |
| JP | 5024842 B1 | 9/2012 | |
| KR | 1020120039659 | 4/2012 | ............ G01N 21/94 |
| KR | 1020200111237 | 9/2020 | ............... G03F 7/20 |
| KR | 1020210043701 | 4/2021 | ............... G03F 7/20 |
| TW | 201621473 A | 6/2016 | |
| TW | 202138911 | 10/2021 | ............... G03F 1/84 |
| TW | 202201145 | 1/2022 | ............... G03F 7/20 |
| WO | WO 2020/069870 | 4/2020 | ............... G03F 7/20 |
| WO | WO 2022/248216 | 12/2022 | ............... G03F 1/84 |

OTHER PUBLICATIONS

The Office Action issued by the German Patent Office for Application No. DE 10 2022 100 591.7, dated Aug. 5, 2022 (with English Translation).

Pauer et al., "Multilayer optics for EUV and beyond", *Fraunhofer IOF, Institute for Applied Optics and Precision Engineering*, Dublin, Nov. 14, 2010.

NTT-AT's Opticsa and Materials, EUV catalog.pdf, "https://www.ntt-at.com/product/beamsplitter" (downloaded in 2023).

The Office Action and Search Report issued by the Taiwan Patent Office for Application No. TW 111150563, dated Nov. 3, 2023 (with English Translation).

The Office Action issued by the Korean Patent Office for Application No. KR 10-2023-0001605, dated Jan. 20, 2025 (with English Translation).

Sobierajski et al: "Mo/Si multilayer-coated amplitude-division beam splitters for XUV radiation sources", *Journal of Synchrotron Radiation*, vol. 20, pp. 249-257 (2013).

The Notice of Allowance issued by the Korean Patent Office for Application No. KR 10-2023-0001605, dated Jul. 22, 2025 (with English Translation).

The Office Action issued by the Chinese Patent Office for Application No. CN 202310037467.2, dated Jul. 25, 2025 (with English Translation).

Office Action in Chinese Appln. No. 202310037467.2, mailed on Feb. 11, 2026, 18 pages (with English translation).

Notice of Allowance and Search Report in Chinese Appln. No. 202310037467.2, mailed on May 11, 2026, 12 pages (with English translation).

* cited by examiner

12° = NA 0.20
Illumination = NA 0.20
Imaging = NA 0.20

OPTICAL SYSTEM, IN PARTICULAR FOR CHARACTERIZING A MICROLITHOGRAPHY MASK

CROSS-REFERENCE TO RELATED APPLICATIONS

The present application claims priority under 35 U.S.C. § 119 from German Patent Application DE 10 2022 100 591.7, filed on Jan. 12, 2022, the entire content of which is incorporated herein by reference.

TECHNICAL FIELD

The invention relates to an optical system, in particular for characterizing a microlithography mask.

BACKGROUND

Microlithography is used for producing microstructured components, such as for example integrated circuits or liquid crystal displays (LCDs). The microlithography process is carried out in what is known as a projection exposure apparatus, which includes an illumination device and a projection lens. The image of a mask (=reticle) illuminated by use of the illumination device is projected in this case by use of the projection lens onto a substrate (for example a silicon wafer) that is coated with a light-sensitive layer (photoresist) and arranged in the image plane of the projection lens in order to transfer the mask structure to the light-sensitive coating of the substrate.

In the lithography process, undesired defects on the mask have a particularly disadvantageous effect since they can be reproduced with every illumination step. A direct analysis of the imaging effect of possible defect positions is thus desirable in order to minimize the mask defects and in order to realize a successful mask repair. In principle, there therefore is a demand for a quick and easy measurement or qualification of the mask. In this case, the practice of recording and evaluating an aerial image of a section of the mask in a mask inspection apparatus in particular is known, wherein, for the purposes of recording the aerial image, the structures to be measured on the mask are illuminated by a magnifying illumination optics unit and the light coming from the mask is projected on a detector unit via an imaging optical unit and detected by said detector unit. In the process, even relatively large contiguous areas, in particular also the entire optically effective surface of the mask, may be scanned to find defects.

In a general conventional structure, FIG. 6 shows a mask inspection apparatus 600 comprising an illumination optical unit 601 and an imaging optical unit 605, wherein light from a light source (not shown in FIG. 6) enters the illumination optical unit 601 and directs an illumination beam 602 at a mask 603 arranged in the object plane of the imaging optical unit 605, and wherein the illuminated region of the mask 603 is imaged by use of an imaging beam 604 onto a sensor arrangement 606, for example a charge-coupled device (CCD) camera, by use of/via the imaging optical unit 605.

With respect to the prior art, reference is made, purely by way of example, to DE 10 2017 221 146 A1, US 2014/0240686 A1, U.S. Pat. No. 7,982,854 B2, DE 10 2012 202 057 B4 and publication R. Sobieraj ski et al: "Mo Si multilayer-coated amplitude-division beam splittersfor XUV radiation sources", J. Synchrotron Rad. (2013) 20, pages 249-257.

SUMMARY

It is an aspect of the present invention to provide an optical system, in particular for characterizing a microlithography mask, which optical system allows the best possible exploitation of the resolution obtainable in the EUV range and enables an increased measurement accuracy accompanying this.

This aspect is achieved by way of the optical system according to the features of independent Claim 1.

An optical system according to the invention comprises:
- a light source for generating light of a wavelength of less than 30 nm;
- an illumination beam path leading from the light source to an object plane;
- an imaging beam path leading from the object plane to an image plane; and
- a beam splitter, via which both the illumination beam path and the imaging beam path run.

The invention is based in particular on the concept of enabling a separation of the illumination beam path, which leads from a light source to an object plane, from an imaging beam path, which leads from said object plane to an image plane, by way of a beam splitter in an imaging optical system designed for EUV operation, in such a way that both the illumination beam path and the imaging beam path are partially guided via said beam splitter. As a consequence, a substantially perpendicular illumination of the object plane is enabled according to the invention even without a geometric separation of illumination beam path and imaging beam path, and this is particularly advantageous for a number of reasons especially during the application according to the invention to a piece of equipment for characterizing a microlithography mask in which a mask to be characterized is in said object plane under perpendicular illumination:

Firstly, the substantially perpendicular mask illumination enabled according to the invention takes account of the fact that, according to the angle-dependent curve depicted in the diagram of FIG. 3, the reflection of a mask designed for the EUV range drops off significantly for relatively large angles of incidence (in relation to the surface normal)—in an angle of incidence range of more than 12° according to the diagram in FIG. 3—with the consequence that ultimately a correspondingly restricted angle of incidence range (which corresponds to a numerical aperture of approximately NA=0.2) is available to the illumination beam path and imaging beam path since the mask reflects to a sufficient extent only within this angle of incidence range. The guidance according to the invention of both the illumination beam path and the imaging beam path via one beam splitter now allows said NA range to be used in full, both for the illumination beam path and the imaging beam path, and consequently allows a comparatively high resolution to be achieved (in particular also in comparison with the resolution ultimately obtainable within the EUV projection exposure apparatus).

Moreover, a mask-side telecentric beam path can as a result be realized by way of the substantially perpendicular mask illumination allowed due to the concept according to the invention and this is advantageous, in particular, when determining placement errors on the mask (a so-called "registration") since—in comparison with an oblique mask illumination—possible focusing errors in the mask positioning have a less severe effect on the accuracy of the respective position determination.

By using a beam splitter suitable for operation in the EUV range (which must meet comparatively stringent demands in terms of the plane geometry and transmission homogeneity), the invention deliberately accepts an increased manufacturing outlay and increased light loss (in view of the light in the illumination and imaging beam paths having to be guided via the beam splitter a total of two times) in order, in return, to obtain the above-described advantages, especially in view of the increased resolution and comparatively greater insensitivity to focusing errors and the greater measurement accuracy accompanying this.

According to an embodiment, the centroid ray of an illumination beam incident on the object plane in the illumination beam path is incident on the object plane at an angle with respect to the surface normal of no more than 6°, more particularly at an angle of no more than 4°, further particularly at an angle of 0°.

In the optical system according to the invention, the light in the illumination beam path is reflected at the beam splitter and light in the imaging beam path is transmitted through the beam splitter according to an embodiment. This configuration is particularly advantageous inasmuch as the imaging beam path, which is comparatively sensitive to optical aberrations, only uses the beam splitter in transmission, with the consequence that possible unevenness of the beam splitter is without significant influence on the obtainable image quality (unlike in the case of an operation in reflection) in view of the small thickness of the beam splitter and the circumstance that the refractive index in the EUV has substantially the value of one. However, the invention is not restricted in this respect, and so, in principle, embodiments in which the beam splitter is conversely operated in transmission for the illumination beam path and in reflection for the imaging beam path should likewise be considered as being encompassed by the invention.

According to an embodiment, the beam splitter comprises a multi-layer system on a membrane, with the thickness of this membrane being less than 250 nm, more particularly less than 100 nm, further particularly less than 40 nm.

According to an embodiment the multi-layer system comprises a plurality of partial layer stacks made of a first lamina made of a first material and a second lamina made of a second material, with the number of partial layer stacks being less than 20, more particularly less than 15.

In embodiments, the first material may contain molybdenum (Mo) or ruthenium (Ru). Moreover, the second material may include silicon (Si).

According to an embodiment, the multi-layer system comprises at least one lamina with a varying thickness. This is particularly advantageous if the angles of incidence of the light on the beam splitter vary significantly over the area of the beam splitter. In this case, the layer thickness profile can be chosen such that the layer thickness is optimized for small angles of incidence in the regions in which these small angles of incidence occur and the layer thickness is optimized for larger angles of incidence in regions in which these larger angles of incidence occur.

According to an embodiment, the membrane is produced from silicon (Si), silicon nitride (SiN) or carbon nanotubes.

To avoid an impairment of the functionality of the beam splitter according to the invention as a result of deformation or waviness, the membrane with the multi-layer system situated thereon may be accommodated in a suitable mount, for example a clamping mount.

According to an embodiment, the beam splitter has a transmission inhomogeneity of less than 1%, more particularly less than 0.8%, further particularly less than 0.5%, over its optically used region.

According to an embodiment, the beam splitter has an optically used region, the dimensions of which are at least 30 mm, more particularly at least 40 mm, in one spatial direction.

According to an embodiment, the image beam path runs substantially telecentrically on the mask side or object plane side.

According to an embodiment, there is at least one mirror, more particularly at least two mirrors, along the imaging beam path between the object plane and the beam splitter. By way of one or more such mirrors (each with a planar or else curved geometry on their optically effective surface), it is possible to reduce the angle load of the beam splitter by virtue of a substantially collimated beam path being set at the location of the beam splitter by way of said mirror(s). However, the invention is not restricted thereto, and so embodiments in which there are no further optical components or mirrors between beam splitter and object plane or mask should also be considered as being encompassed by the invention. Such configurations without additional mirrors between the object plane and the beam splitter may likewise be advantageous in view of a reduction, desirable in principle, in the number of mirrors used overall within the optical system.

According to an embodiment, there consequently is no mirror along the imaging beam path between the object plane and the beam splitter.

According to an embodiment, the light from the light source has a wavelength of less than 15 nm, more particularly within the range between 13 nm and 14 nm.

According to an embodiment, the optical system is a piece of equipment for characterizing a microlithography mask, with a mask to be characterized which is arranged in the object plane being illuminated via the illumination beam path and being imaged via the imaging beam path onto a sensor unit arranged in the image plane.

However, the invention is not restricted thereto but is also advantageously usable in further applications—for example in an optical system for characterizing mask blanks of lithography masks or in a microscope.

Further, the invention also relates to a beam splitter for use in an optical system having the above-described features, and to the use of a beam splitter in an optical system having the above-described features, wherein the beam splitter comprises a multi-layer system on a membrane, with the thickness of this membrane being less than 250 nm, more particularly less than 100 nm, further particularly less than 40 nm. With regard to advantages and preferred configurations of the beam splitter, reference is made to the aforementioned explanations in the context of the optical system according to the invention.

Further configurations of the invention are evident from the description and the dependent claims.

The invention is explained in greater detail below on the basis of exemplary embodiments illustrated in the accompanying figures.

DETAILED DESCRIPTION

Below, exemplary embodiments of an optical system according to the invention are described with reference to the schematic representations in FIGS. 1-5B. Common to these embodiments is the use of a beam splitter in an imaging optical system designed for operation in the EUV, the use being such that both the illumination beam path and the imaging beam path partially run via said beam splitter and consequently allow a substantially perpendicular illumination or imaging of an object, for example a mask to be characterized, even without a geometric separation of illumination beam path and imaging beam path.

Figure 1:
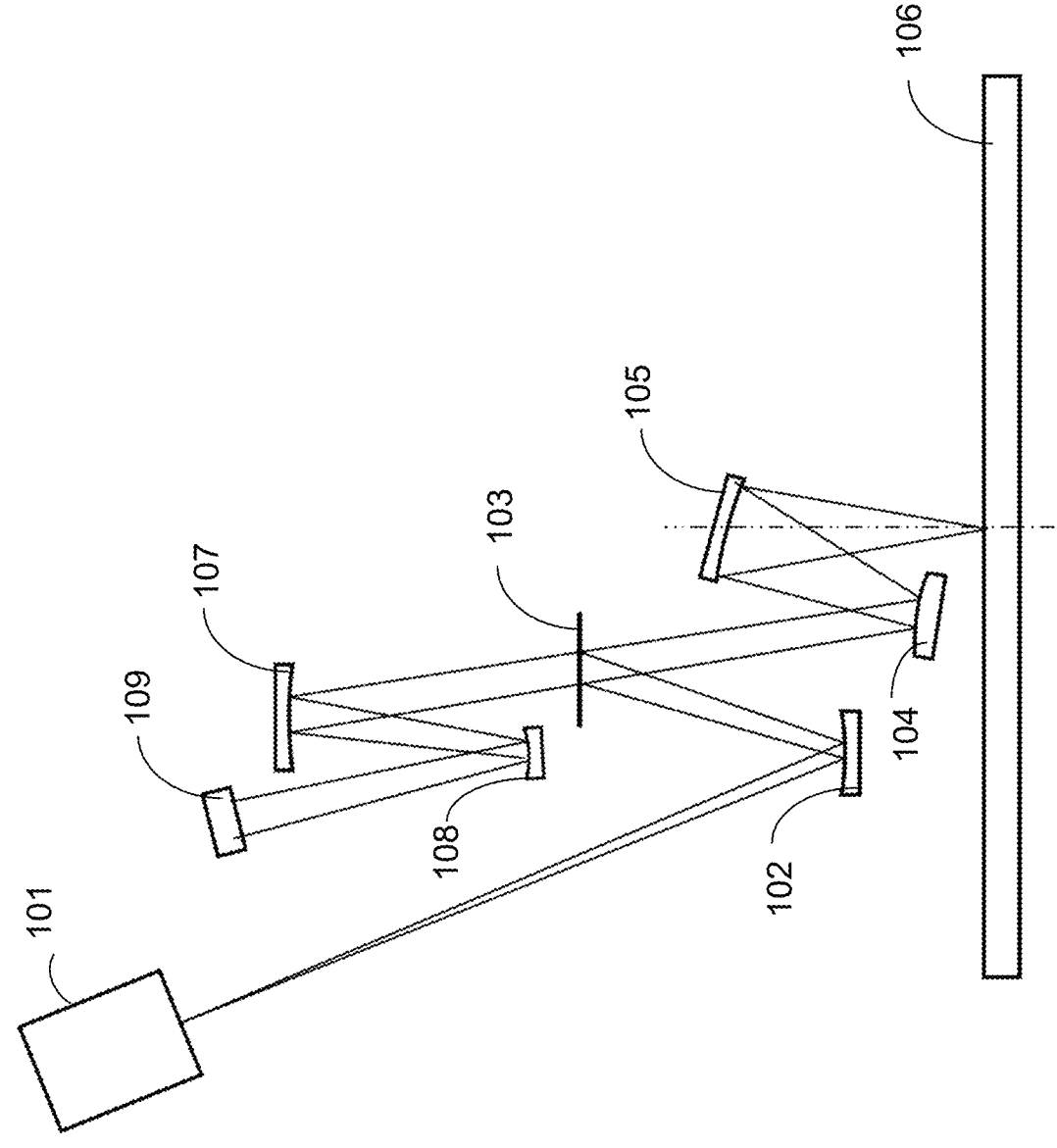
FIG. 1 shows a schematic representation for explaining the possible structure of an optical system according to the invention for characterizing a mask.

In a purely schematic representation, FIG. 1 shows the possible structure of an optical system according to the invention for characterizing an EUV lithography mask in a first embodiment.

According to FIG. 1, the (EUV) light emitted by a light source 101 is initially incident on the mask 106 to be characterized, which is situated in an object plane, having passed along an illumination beam path via a mirror 102 and the beam splitter 103 according to the invention and further mirrors 104 and 105. Following reflection at the mask 106, the light finds its way into an imaging beam path which initially runs via the mirrors 105, 104 and the beam splitter 103 again, and then via further mirrors 107 and 108 to a sensor unit 109 (e.g., a CCD camera) arranged in an image plane.

According to the exemplary embodiment of FIG. 1—without however the invention being restricted thereto— the beam splitter 103 is operated in reflection for the illumination beam path and in transmission, by contrast, for the imaging beam path. As a consequence, possible unevenness of the beam splitter 103 remains without significant influence on the imaging quality in the imaging beam path—which is substantially more sensitive to aberrations in comparison with the illumination beam path. In further embodiments, the beam splitter 103 can also be operated conversely in transmission for the illumination beam path and in reflection for the imaging beam path.

To enable the transmissive operation for EUV light, the beam splitter 103 is designed as a membrane which is coated with a multi-layer system made of a plurality of alternating molybdenum (Mo) and silicon (Si) layers and which has a thickness of less than 250 nm, more particularly less than 100 nm, further particularly less than 40 nm (said membrane being able to be produced from silicon (Si), silicon nitride (SiN) or carbon nanotubes, for example). To realize substantially corresponding orders of magnitude of the reflectance and transmittance of the beam splitter 103, said multi-layer system has a total of 12 partial layer stacks, each made of one molybdenum layer and one silicon layer, in one exemplary embodiment. However, the invention is not restricted thereto, with the number of partial layer stacks preferably being less than 20, more particularly less than 15, in order to provide a sufficient transmittance of the beam splitter 103.

Further (functional) layers, for example diffusion barrier layers, barrier layers, etc., may also be provided in addition to the aforementioned alternating layers. In this context and in relation to exemplary layer materials, reference is made, purely by way of example, to U.S. Pat. No. 7,982,854 B2, DE 10 2012 202 057 B4, DE 10 2017 221 146 A1, DE 10 2014 222 534 A1 and publication R. Sobierajski et al: "Mo Si multilayer-coated amplitude-division beam splitters for XUV radiation sources", J. Synchrotron Rad. (2013) 20, pages 249-257.

In the exemplary embodiment of FIG. 1, the EUV light is incident in substantially collimated fashion on the beam splitter 103 (i.e., the rays are approximately parallel) in the imaging beam path as a consequence of the deflecting effect of the mirrors 105, 104, with the consequence that the angle of incidence is substantially constant over the region of the beam splitter 103 optically used in transmission, that is to say the angle load on the beam splitter 103 is low.

Figure 2A:
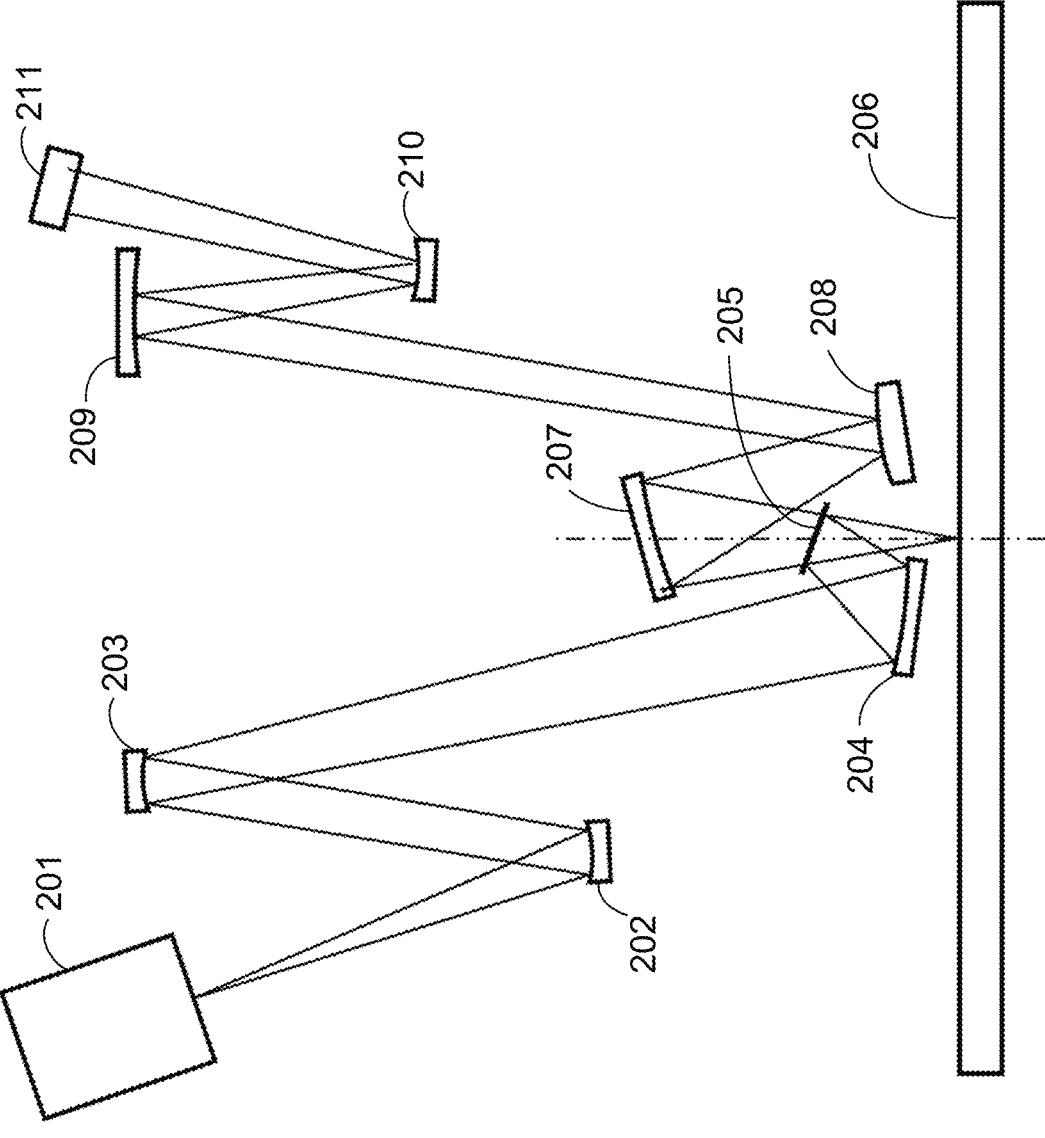
FIGS. 2A-2B show schematic representations for explaining further embodiments of an optical system according to the invention for characterizing a mask.
Figure 2B:
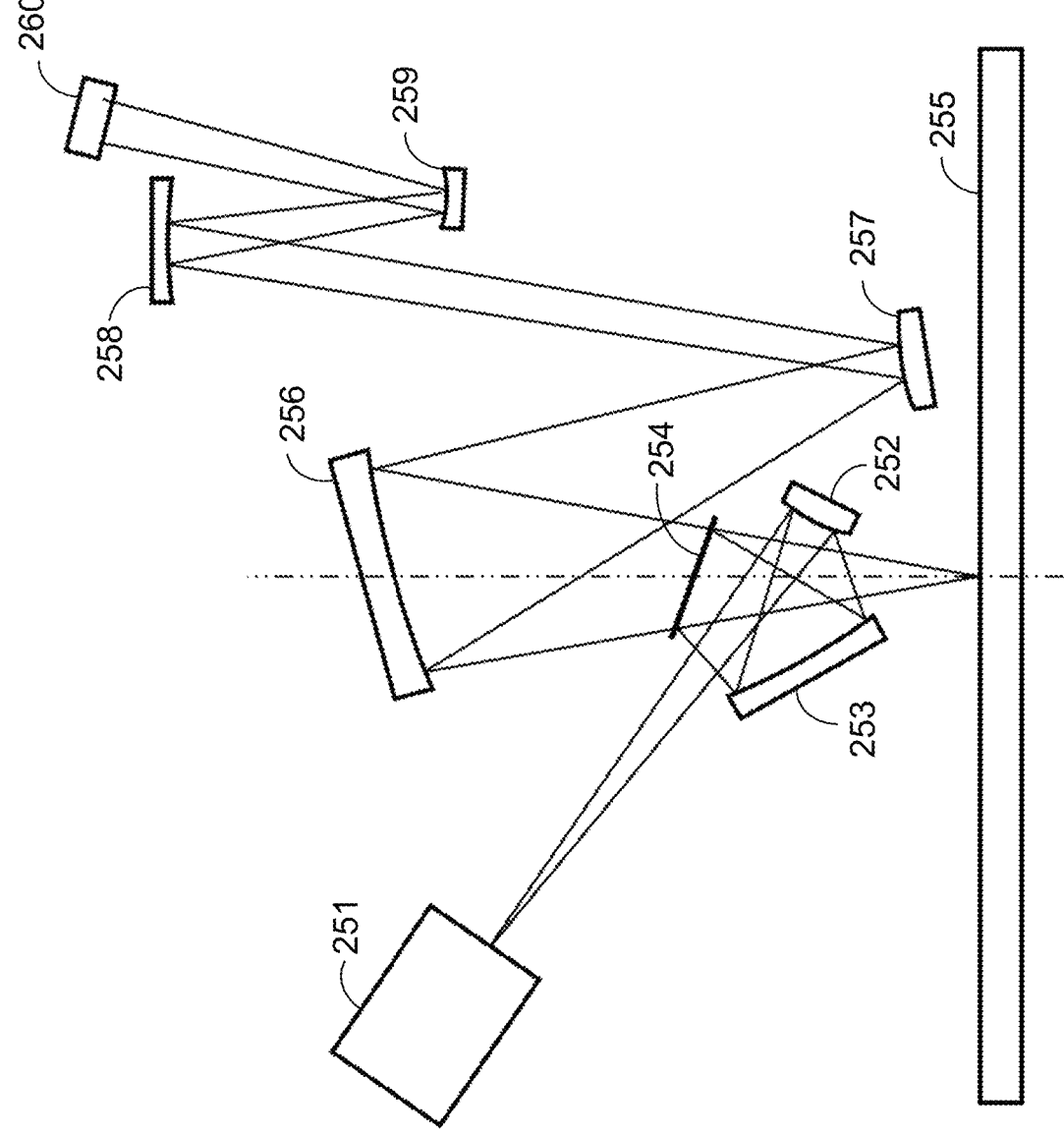
Figure 3:
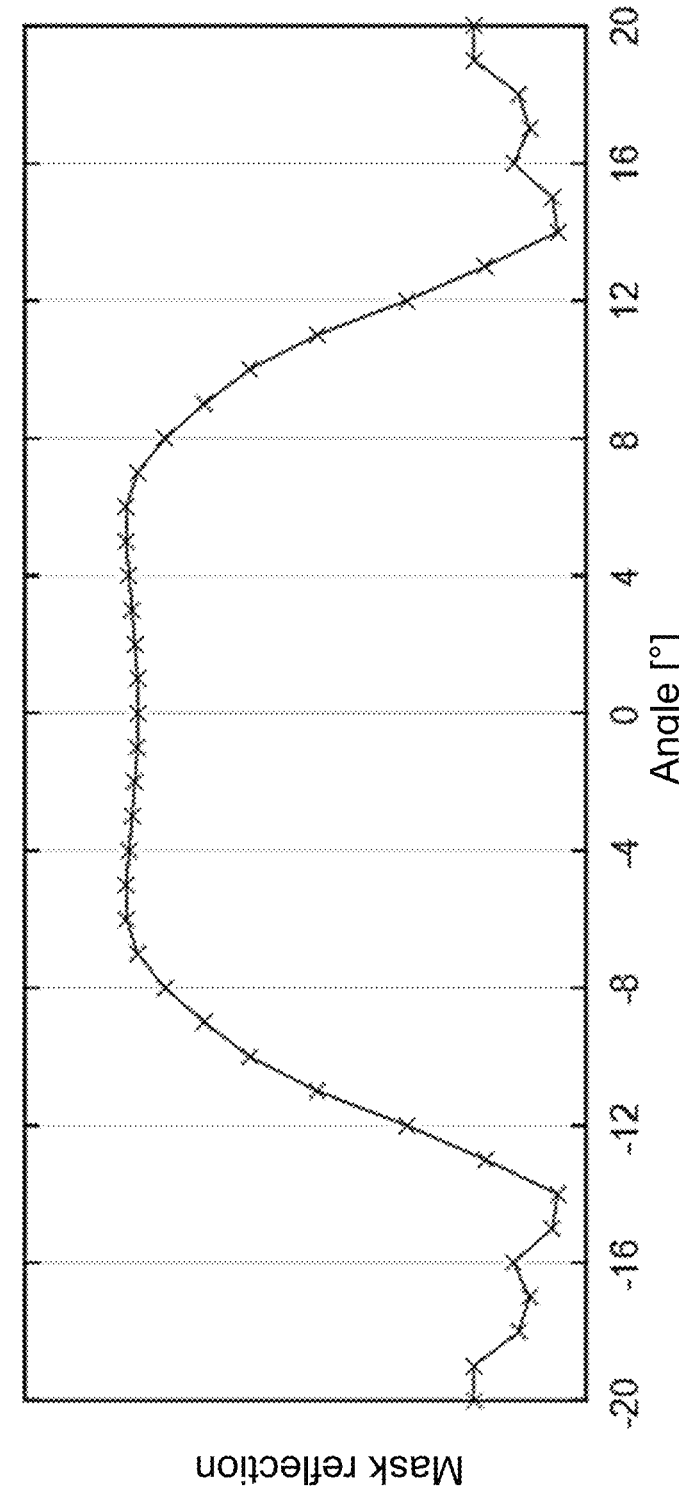
FIG. 3 shows a diagram relating to the angle-dependent curve of the reflectance of a mask designed for the EUV range.

However, the invention is not restricted thereto. FIGS. 2A-2B show possible further embodiments of an optical system according to the invention, in each case in a schematic representation.

According to FIGS. 2A-2B, there are no mirrors in the imaging beam path between mask and beam splitter. To compensate an angle load occurring on the beam splitter in the imaging beam path as a consequence, the multi-layer system of the beam splitter may have a varying thickness (i.e., at least one lamina with a varying thickness).

According to FIG. 2A, EUV light from a light source 201 reaches the beam splitter 205 according to the invention via three mirrors 202, 203, 204 along the illumination beam path, and is then incident on the mask 206 to be characterized, which is situated in the object plane. Following reflection at the mask 206, the light finds its way into the imaging beam path which initially runs via the beam splitter 205 again, and then via further mirrors 207-210 to the sensor unit 211 arranged in the image plane.

According to FIG. 2B, EUV light from the light source 251 reaches the beam splitter 254 according to the invention via two mirrors 252, 253 along the illumination beam path, and is then incident on the mask 255 to be characterized, which is situated in the object plane. Following reflection at the mask 255, the light finds its way into the imaging beam path which initially runs via the beam splitter 254 again, and then via further mirrors 256-259 to the sensor unit 260 arranged in the image plane.

In each of the embodiments described above on the basis of FIG. 1 and FIGS. 2A-2B, a substantially perpendicular mask illumination is achieved both in the illumination beam path and in the imaging beam path by using the beam splitter according to the invention, with it being possible, in this respect, to dispense with a geometric separation of illumination beam path and imaging beam path (as would be required without using the beam splitter according to the invention). An advantage arising from this circumstance, in particular for the resolution ultimately obtainable using the optical system according to the invention, is described below with reference to the schematic representations in FIGS. 4A-4C and FIGS. 5A-5B.

Figures 4A, 4B, 4C:
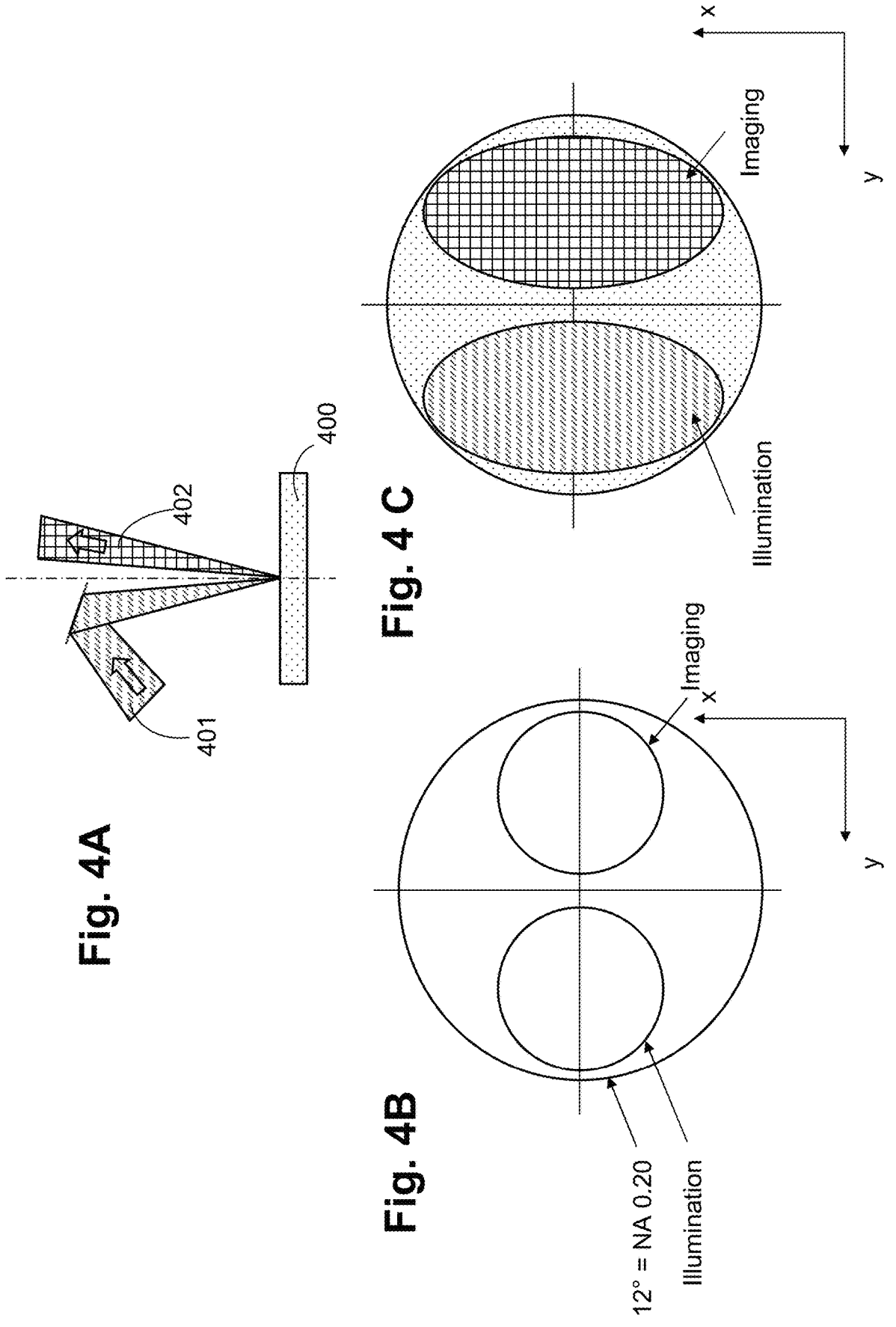
FIGS. 4A-C show schematic representations for explaining exemplary utilizations of the numerical aperture (FIGS. 4B and 4C) available in an EUV system in the case of a geometric separation of illumination and imaging beam paths (FIG. 4A)

FIG. 4A initially shows, purely in a schematic and very much simplified representation, possible conventional geometric beam splitting in the case of oblique illumination of a mask 400, with "401" denoting an illumination beam incident on the mask 401 along the illumination beam path and "402" denoting an imaging beam running in the imaging beam path following reflection at the mask 400. In FIG. 4B and FIG. 4C, the circular region in each case denotes the maximally available numerical aperture in principle taking account of the reflectance of the mask 400 (with a value of NA=0.2 corresponding to the maximum angle of incidence of 12° in accordance with FIG. 3). In FIG. 4B this was based on an optical system with a mask-side numerical aperture (NA) of 0.0825 in the x- and y-directions (in relation to the plotted coordinate system), whereas this was based on an optical system with a mask-side numerical aperture (NA) of 0.06875 in the y-direction and 0.1375 the x-direction in FIG. 4C. It is evident that, according to FIG. 4B and FIG. 4C, the maximally available numerical aperture (NA) in accordance with the reflectance of the mask is used with different efficiencies, and in any case said maximally available numerical aperture (NA) is used only partially.

Figures 5A, 5B:
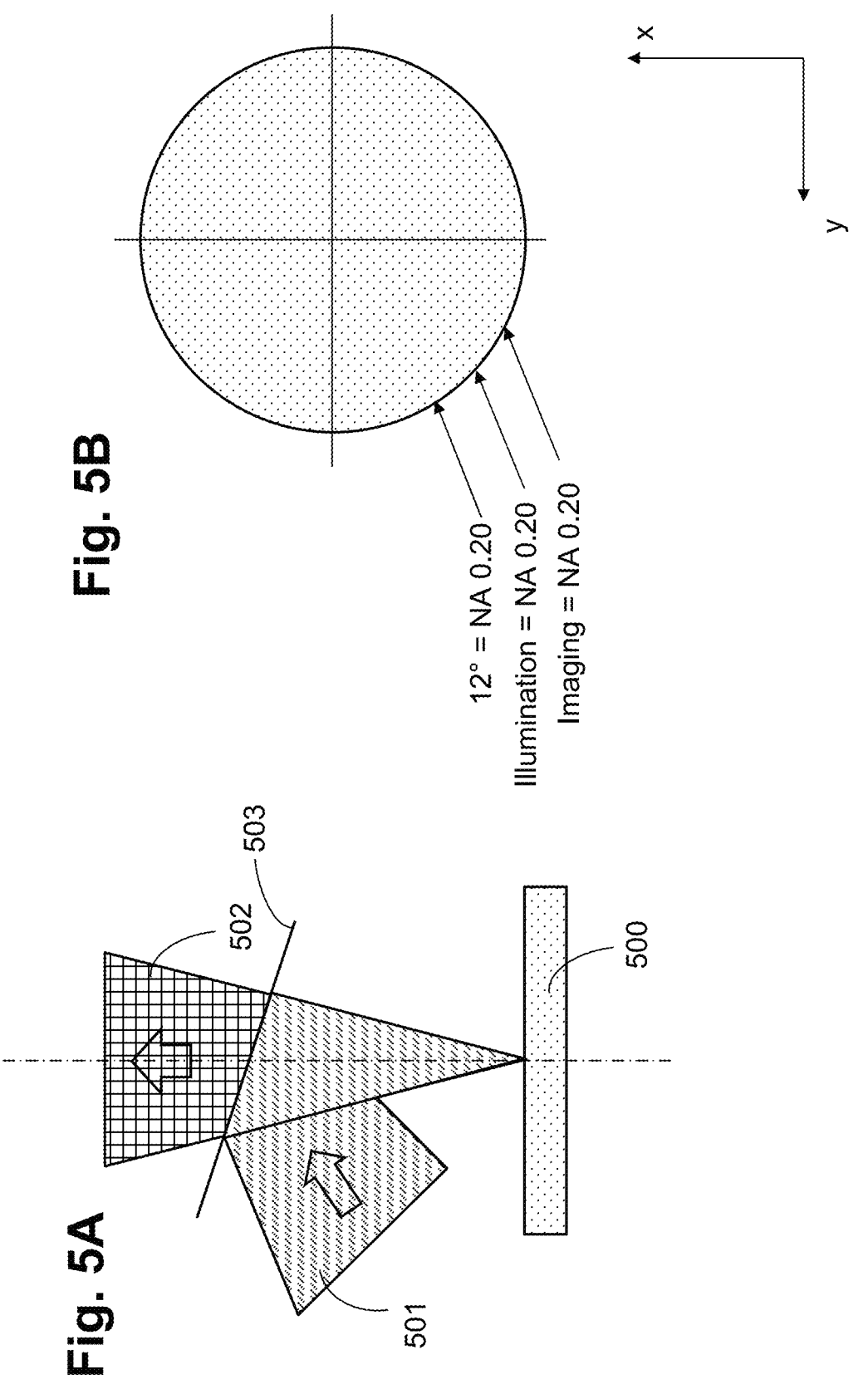
FIGS. 5A-5B show schematic representations for explaining the possible utilization of the available numerical aperture (FIG. 5B) in an EUV system in the case of using a commonly used beam splitter for illumination and imaging beam paths (FIG. 5A)
Figure 6:
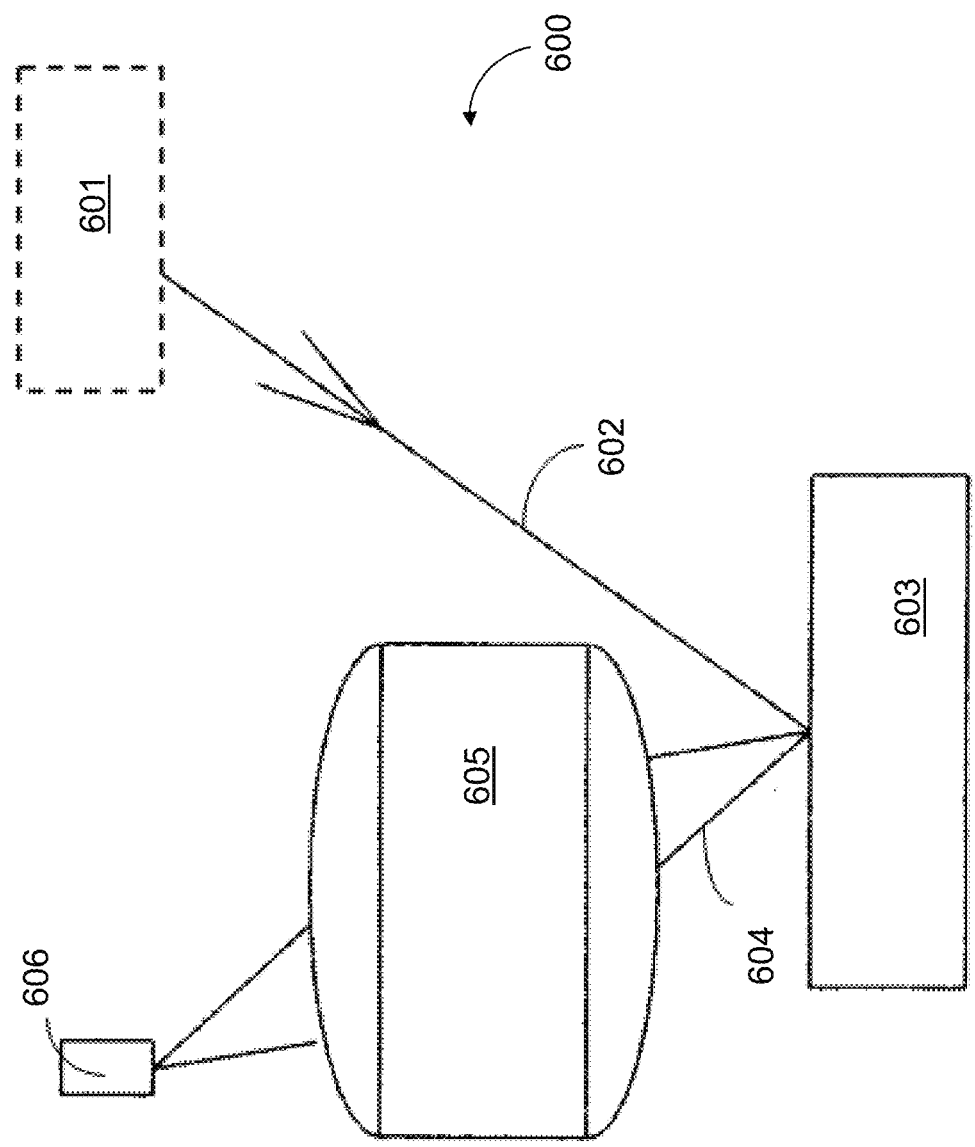
FIG. 6 shows a schematic representation for explaining a conventional general structure of a piece of equipment for characterizing a mask.

In a representation analogous to FIG. 4A, FIG. 5A shows the realization of a substantially perpendicular mask illumination made possible according to the invention, with geometric beam splitting being dispensed with as a consequence of using a beam splitter 503. In this case, an illumination beam 501 running in the illumination beam path is reflected towards the mask 500 by the beam splitter 503, with the reflected light in the imaging beam path then being transmitted through the beam splitter 503 as an imaging beam. According to FIG. 5B, the relevant optical system can then be designed so that the maximally available numerical aperture taking into account the reflectance of the mask 500 (with a value of NA=0.2 corresponding to the maximum angle of incidence of 12° in accordance with FIG. 3) is used in full for both the illumination beam path and the imaging beam path. As a consequence, a significant increase in the attainable resolution is obtained.

A telecentric beam path can be realized as a further advantage of the concept according to the invention of realizing a substantially perpendicular mask illumination and this is advantageous, in particular, when determining placement errors on the mask (so-called "registration") since—in comparison with an oblique mask illumination— possible focusing errors in the mask positioning have a less severe effect on the accuracy of the respective position determination.

Even though the invention has been described on the basis of specific embodiments, numerous variations and alternative embodiments will be apparent to a person skilled in the art, for example by the combination and/or exchange of features of individual embodiments. Accordingly, it goes without saying for a person skilled in the art that such variations and alternative embodiments are also encompassed by the present invention, and the scope of the invention is limited only within the meaning of the appended claims and the equivalents thereof.

What is claimed is:
1. An optical system comprising:
   a light source for generating light of a wavelength of less than 30 nm;

an illumination beam path leading from the light source to an object plane, wherein there is at least one mirror in the illumination beam path between the light source and the object plane;
   an imaging beam path leading from the object plane to an image plane, wherein there is at least one mirror in the imaging beam path between the object plane and the image plane; and
   a beam splitter, via which both the illumination beam path and the imaging beam path of the light of the wavelength of less than 30 nm run;
   wherein the light in the illumination beam path is reflected at the beam splitter and light in the imaging beam path is transmitted through the beam splitter.

2. The optical system of claim 1, wherein the centroid ray of an illumination beam incident on the object plane in the illumination beam path is incident on the object plane at an angle with respect to the surface normal of no more than 6°.

3. The optical system of claim 1, wherein the beam splitter comprises a multi-layer system on a membrane, with the thickness of this membrane being less than 250 nm.

4. The optical system of claim 3, wherein the multi-layer system comprises a plurality of partial layer stacks made of a first lamina of a first material and a second lamina of a second material, with the number of partial layer stacks being less than 20.

5. The optical system of claim 4, wherein the first material contains molybdenum (Mo) or ruthenium (Ru).

6. The optical system of claim 4, wherein the second material contains silicon (Si).

7. The optical system of claim 3, wherein the multi-layer system comprises at least one lamina with a varying thickness.

8. The optical system of claim 3, wherein the membrane is produced from silicon (Si), silicon nitride (SiN) or carbon nanotubes.

9. The optical system of claim 1, wherein the beam splitter has a transmission inhomogeneity of less than 1% over its optically used region.

10. The optical system of claim 1, wherein the beam splitter has an optically used region, the dimensions of which are at least 30 mm in one spatial direction.

11. The optical system of claim 1, wherein the imaging beam path runs substantially telecentrically on the object plane side.

12. The optical system of claim 1, wherein there is no mirror along the imaging beam path between the object plane and the beam splitter.

13. The optical system of claim 1, wherein there is at least one mirror along the imaging beam path between the object plane and the beam splitter.

14. The optical system of claim 1, wherein the light from the light source has a wavelength of less than 15 nm.

15. The optical system of claim 1, wherein the optical system is a piece of equipment for characterizing a microlithography mask, with a mask to be characterized which is arranged in the object plane being illuminated via the illumination beam path and being imaged via the imaging beam path onto a sensor unit arranged in the image plane.

16. The optical system of claim 15, wherein the centroid ray of an illumination beam incident on the object plane in the illumination beam path is incident on the object plane at an angle with respect to the surface normal of no more than 6°.

17. A beam splitter configured to be used in an optical system of claim 1, wherein the beam splitter comprises a multi-layer system on a membrane, with the thickness of this membrane being less than 250 nm.

18. A method comprising: using a beam splitter in an optical system of claim 1, wherein the beam splitter comprises a multi-layer system on a membrane, with the thickness of this membrane being less than 250 nm.

19. The optical system of claim 1, wherein the beam splitter comprises a multi-layer system on a membrane, with the thickness of this membrane being less than 40 nm.

20. The optical system of claim 1, wherein the beam splitter has a transmission inhomogeneity of less than 0.5% over its optically used region.

* * * * *